United States Patent
Truessel et al.

(10) Patent No.: US 12,489,039 B2
(45) Date of Patent: Dec. 2, 2025

(54) PRE-PRODUCT, METHOD AND ELECTRONIC DEVICE

(71) Applicant: Hitachi Energy Ltd, Zürich (CH)

(72) Inventors: Dominik Truessel, Bremgarten (CH); Harald Beyer, Lenzburg (CH); Robert Gade, Birr (CH); Milad Maleki, Untersiggenthal (CH)

(73) Assignee: HITACHI ENERGY LTD, Zürich (CH)

( * ) Notice: Subject to any disclaimer, the term of this patent is extended or adjusted under 35 U.S.C. 154(b) by 393 days.

(21) Appl. No.: 18/021,821

(22) PCT Filed: Aug. 10, 2021

(86) PCT No.: PCT/EP2021/072260
§ 371 (c)(1),
(2) Date: Feb. 17, 2023

(87) PCT Pub. No.: WO2022/048866
PCT Pub. Date: Mar. 10, 2022

(65) Prior Publication Data
US 2023/0352377 A1   Nov. 2, 2023

(30) Foreign Application Priority Data
Sep. 2, 2020   (EP) .................... 20194119

(51) Int. Cl.
*H01L 23/49*   (2006.01)
*H01L 21/683*   (2006.01)
(Continued)

(52) U.S. Cl.
CPC .... *H01L 23/49565* (2013.01); *H01L 21/6835* (2013.01); *H01L 23/49537* (2013.01);
(Continued)

(58) Field of Classification Search
CPC . H01L 23/495–49596; H01L 23/49861; H01L 21/4821–4842;
(Continued)

(56) References Cited

U.S. PATENT DOCUMENTS

| | | | |
|---|---|---|---|
| 10,079,198 B1 * | 9/2018 | Cadag | ................ H01L 23/3192 |
| 2008/0230883 A1 | 9/2008 | Yee et al. | |

(Continued)

FOREIGN PATENT DOCUMENTS

| | | |
|---|---|---|
| CN | 201369329 Y | 12/2009 |
| CN | 201853698 U | 6/2011 |

(Continued)

*Primary Examiner* — Moin M Rahman
(74) *Attorney, Agent, or Firm* — Procopio, Cory, Hargreaves & Savitch LLP

(57) ABSTRACT

In one embodiment, a pre-product is configured for an electronic device intended to be loaded with a maximum current of at least 10 A, and comprises: an electronic component, a plurality of power terminals for external electrical contacting the electronic device, and a slide rail at an end of the at least one assigned power terminal remote from the electronic component. The power terminals are electrically connected to the electronic component and extend in a direction away from the electronic component. The slide rail is integrated in a metallic first leadframe together with at least one of the power terminals. A weight of the pre-product is at least 0.1 kg.

11 Claims, 6 Drawing Sheets

Figure 5:
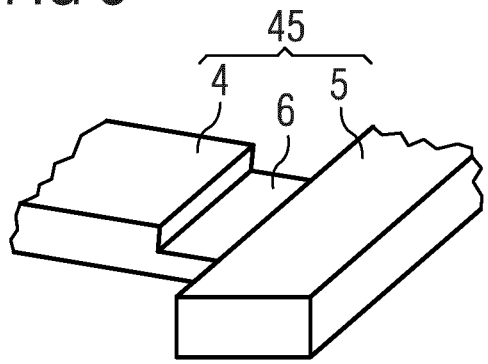

(51) Int. Cl.
*H01L 23/00* (2006.01)
*H01L 23/495* (2006.01)
*H01L 25/065* (2023.01)

(52) U.S. Cl.
CPC .. *H01L 23/49575* (2013.01); *H01L 23/49579* (2013.01); *H01L 24/48* (2013.01); *H01L 25/0655* (2013.01); *H01L 2221/68309* (2013.01); *H01L 2224/48137* (2013.01); *H01L 2224/48225* (2013.01); *H01L 2224/48245* (2013.01); *H01L 2924/182* (2013.01)

(58) Field of Classification Search
CPC ............. H01L 23/4952–49531; H01L 23/49811–49816; H01L 2224/16245–1626; H01L 2224/32245–3226; H01L 23/49575; H01L 23/49534; H01L 23/49582; H01L 23/49866–49888; H01L 23/49805; H01L 23/3128; H01L 2224/16155–16168; H01L 2224/16225–1624; H01L 2224/24155; H01L 2224/24225–24227; H01L 2224/32155–32168; H01L 2224/32225–3224; H01L 2224/40155–40165; H01L 2224/40225–4024; H01L 2224/48155–48165; H01L 2224/48225–4824; H01L 23/49565; H01L 21/6835; H01L 23/49537; H01L 23/49579; H01L 24/48; H01L 25/0655; H01L 2221/68309; H01L 2224/48137; H01L 2224/48245; H01L 2924/182; H01L 23/4334; H01L 2224/48091; H01L 2224/48227; H01L 2224/48247; H01L 23/3735; H01L 23/49555; H01L 2924/181; H01L 23/49541

See application file for complete search history.

(56) References Cited

U.S. PATENT DOCUMENTS

| | | | |
|---|---|---|---|
| 2014/0097498 | A1* | 4/2014 | Fernando .......... H01L 23/49513 257/368 |
| 2016/0056095 | A1 | 2/2016 | Yeap et al. |
| 2019/0229044 | A1 | 7/2019 | Saiyajitara et al. |

FOREIGN PATENT DOCUMENTS

| | | |
|---|---|---|
| JP | S59-175731 A | 10/1984 |
| JP | H05299576 A | 11/1993 |
| JP | 2003-324176 A | 11/2003 |
| JP | 2006-332573 A | 12/2006 |
| JP | 2008502159 A | 1/2008 |
| JP | 2016-207974 A | 12/2016 |
| WO | 2015/083263 A1 | 6/2015 |

* cited by examiner

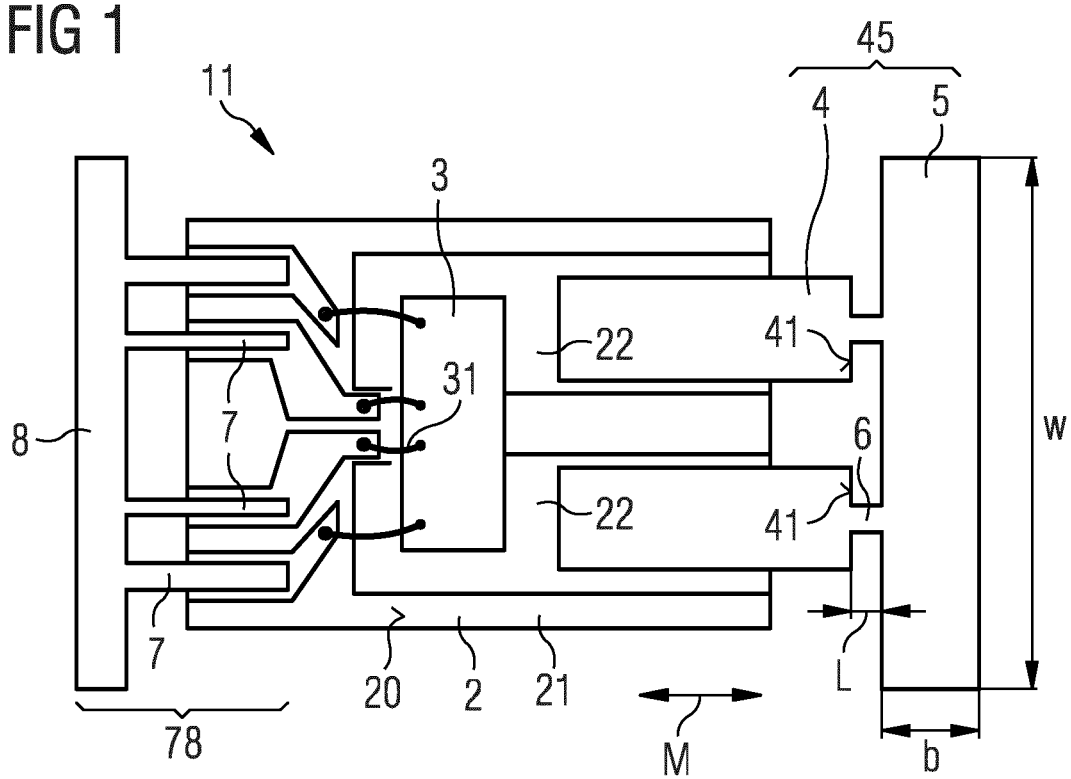
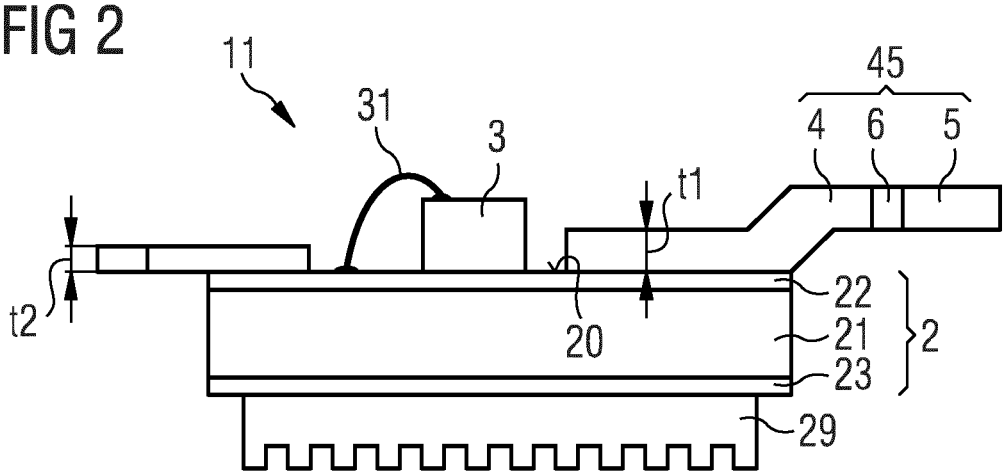

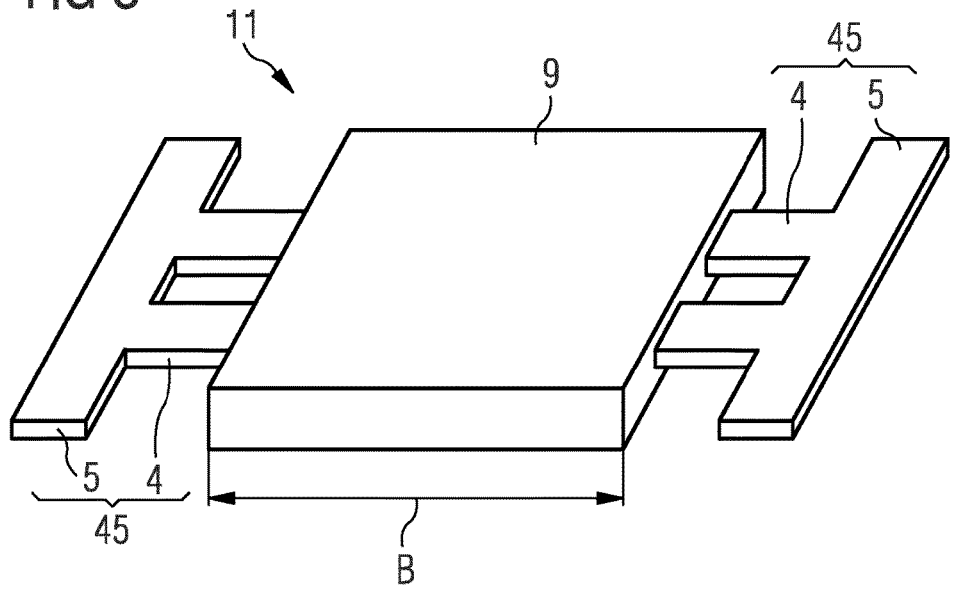
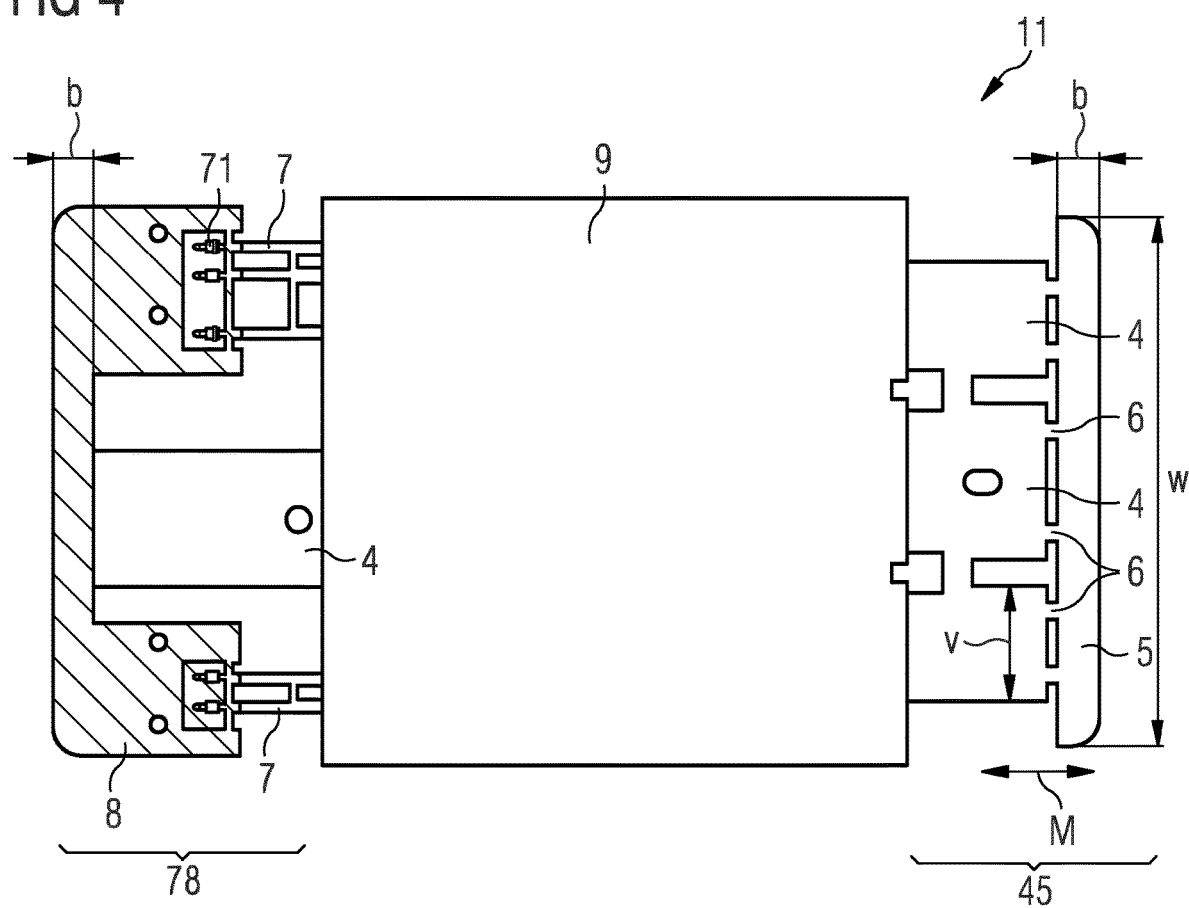

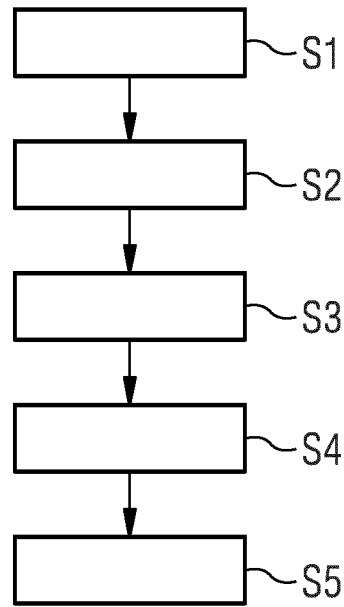
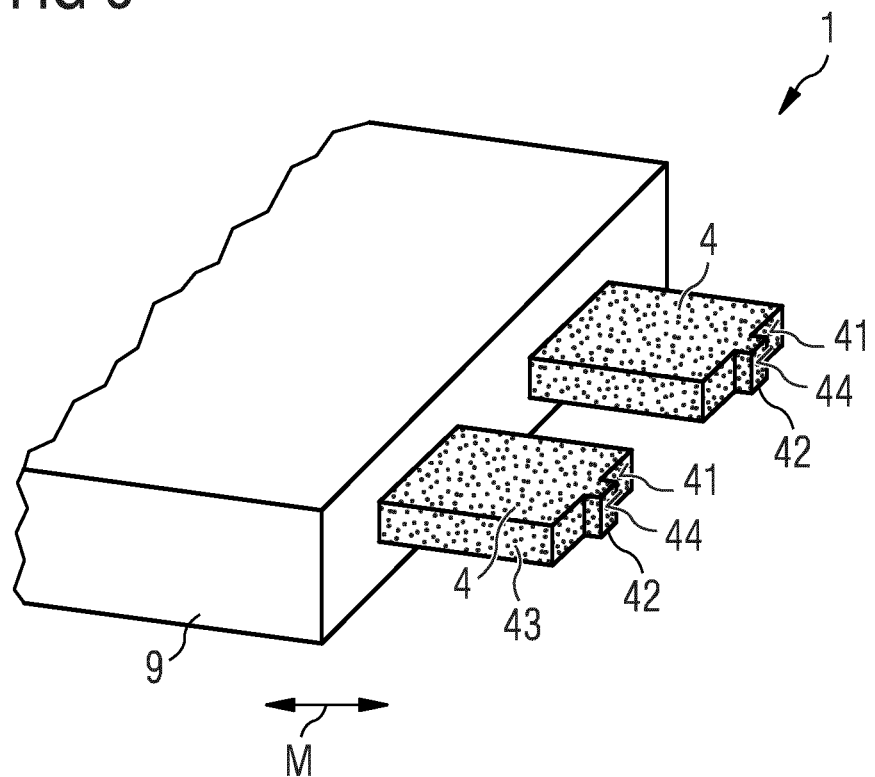

PRE-PRODUCT, METHOD AND ELECTRONIC DEVICE

The present application is a national stage entry of International Patent Application No. PCT/EP2021/072260, filed on Aug. 10, 2021, which claims priority to European Patent Application No. 20194119.2, filed on Sep. 2, 2020, which are both hereby incorporated herein by reference as if set forth in full.

A pre-product for an electronic device is provided. Further, a method of using the pre-product is also provided. Moreover, an electronic device is provided that is made from the pre-product.

Document CN 201 369 329 Y discloses a heat-resistant moisture-proof high-power leadframe that improves mechanical shock resistance and thermal fatigue resistance, and prolongs service life of finished products.

Document CN 201 853 698 U discloses a short-pin triode leadframe.

Document JP 2016-207 974 A provides a leadframe having a plurality of leads including a small-signal lead and a power-signal lead, the leadframe being able to restrict curving of a substrate resulting from a difference between the substrate and the leadframe in coefficient of linear expansion.

Document US 2016/0056095 A1 refers to a leadframe strip with a sawing enhancement feature.

Document US 2019/0229044 A1 refers to a lead frame which is formed with exposed lead tips.

A problem to be solved is to provide a pre-product for an electronic device that can efficiently be handled without damaging power terminals.

This object is achieved, inter alia, by a pre-product, by a method and by an electronic device as defined in the independent patent claims. Preferred further developments constitute the subject matter of the dependent claims.

For example, the pre-product has a slide rail that is later removed. The slide rail is configured to be a support surface of the pre-product when the pre-product is at least one of stored, for example, intermediate stored, processed, cleaned, inspected, tested, handled and moved. Thus, not the power terminals but only the slide rail is in danger of being scratched during storing, processing, cleaning, inspecting, testing, handling and/or moving the pre-product. This applies, for example, because the power terminals are of a soft metal like copper and the pre-product has a comparably high weight.

In at least one embodiment, the pre-product is for an electronic device and comprises:
  as an option, a substrate,
  for example, one or more electronic components,
  a plurality of power terminals for external electrical contacting the electronic device, the power terminals are electrically connected to the electronic components and extend in a direction away from the at least one electronic component, and
  one or more slide rails at at least one end of the power terminals remote from the electronic component or the substrate, wherein the at least one slide rail is integrated in a metallic first leadframe together with one, some or all of the power terminals, and the at least one slide rail may short-circuit the respective power terminals. For example, a weight of the pre-product and the finished electrical device is at least 0.1 kg and/or the electronic device is configured to be loaded with a maximum current of at least 10 A.

In at least one embodiment, the pre-product is for an electronic device and comprises:
  as an option, a substrate,
  for example, one or more electronic components,
  a plurality of power terminals for external electrical contacting the electronic device, the power terminals are electrically connected to the electronic components and extend in a direction away from the at least one electronic component, and
  one or more slide rails at at least one end of the power terminals remote from the electronic component or the substrate, wherein the at least one slide rail is integrated in a metallic first leadframe together with one, some or all of the power terminals, and the at least one slide rail may short-circuit the respective power terminals. For example, a weight of the pre-product and the finished electrical device is at least 0.1 kg and/or the electronic device is configured to be loaded with a maximum current of at least 10 A. The nose pieces are located in each case between one of the ends of the respective power terminal and the associated slide rail and are integrated in the first leadframe. A length of the nose pieces, between the respective end of the assigned power terminal and the slide rail, is at most 25% of a breadth of the slide rail.

The at least one electronic component is, for example, a semiconductor component. For example, the component is a high-power component like a thyristor or a transistor. There can be different kinds of electronic components in the pre-product, like high-power components in combination with integrated circuits to provide control functions.

The term power terminal means that the respective terminal is configured for a maximum current to be handled of at least 10 A or of at least 50 A or of at least 100 A or of at least 500 A. Hence, the power terminals and, thus, the electric device are/is designed to be loaded with high currents. Accordingly, the previous term high-power component refers to such currents fed into the finished electric device.

If the pre-product includes the substrate or a plurality of substrates, the at least electronic component is, for example, mounted on the at least one substrate. Otherwise, the at least one the electronic component is mounted on the first leadframe itself, or on another leadframe. If there is a plurality of substrates, these substrates are, for example, mounted on a common base plate like a heat sink.

For example, if there is at least one substrate, the power terminals are rigidly attached to the substrate so that in intended use the first leadframe does not significantly move or bend relative to the substrate. That is, the substrate can then be regarded a carrier of at least one electronic component. Hence, the first leadframe together with the substrate can be handled as a single rigid unit. For example, when the pre-product is hold only by means of the at least one slide rail and optionally by means of at least one edge rail, a shape of the pre-product does not significantly change due to the weight of the pre-product.

According to at least one embodiment, the pre-product further comprises nose pieces. The nose pieces are located in each case between one of the ends of the respective power terminal and the slide rail. For example, the nose pieces are integrated in the first leadframe. For example, a cross-section area of each one of the nose pieces is at most 90% or at most 50% or at most 25% of a cross-section area of the assigned power terminal. Thus, the cross-section area of the nose pieces is smaller than the cross-section area of the assigned power terminal.

Alternatively or additionally, the nose pieces could be a region between the respective end and the slide rail comprising a target breakline or the like. The target breakline is realized, for example, by a local material weakness and/or by a thinner region of the respective leadframe.

By means of such nose pieces, the at least one slide rail can easily be removed from the power terminals. Said cross-section area, for example, refers to a cross-section in a direction perpendicular with a main side of the substrate and/or in parallel with a direction of a main extent of the slide rail. Said term 'direction of main extent' refers, for example, to a slide direction.

There can be exactly one nose piece per power terminal, or there is more than one nose piece per power terminal for all or for some of the power terminals. Having more than one nose piece per power terminal allows for a mechanically stable pre-product, for example, considering large power terminals.

According to at least one embodiment, the substrate comprises a non-metallic base body. The base body is, for example, of a ceramic or semiconductor material. For example, there is at least one coating, for example, a conductive, metallic coating, on the base body. For example, the substrate comprises one metallic coating on each main side. By means of such a substrate, the electronic component can efficiently be mounted and electrically contacted.

According to at least one embodiment, a thickness of the first leadframe is at least 0.2 mm and at most 5 mm or is at least 0.5 mm and at most 5 mm. For example, said thickness is between 0.8 mm and 3 mm inclusive, for example, between 1.0 mm and 3 mm inclusive. Thus, high currents can be fed into the device by means of the power terminals.

According to at least one embodiment, a length of the nose pieces, between the respective end and the assigned power terminal, is at most 50% or 25% or 15% of a breadth of the slide rail. Thus, high mechanical strength of the first leadframe can be ensured.

According to at least one embodiment, a width of the slide rail is at least 0.5 cm or at least 1 cm or at least 2 cm or at least 3 cm or at least 5 cm, in a direction perpendicular to a main extent of the assigned power terminals. Said main extent, for example, refers to the direction along which the respective power terminal runs away from the substrate.

Alternatively or additionally, an extent, that is, the breadth, of the slide rail is at least 1 mm or at least 2 mm or at least 3 mm or at least 5 mm or at least 7 mm, in the direction parallel to the main extent of the assigned power terminals. Hence, the slide rail is comparably long and can provide a stable support surface for the pre-product, for example, to avoid rotation and to ensure secure guidance.

According to at least one embodiment, a width of the power terminals at the ends is in each case at least 1 mm or at least 3 mm or at least 6 mm or at least 10 mm, in the direction perpendicular to the main extent of the respective power terminal. Alternatively or additionally, this width is at most 8 cm or at most 3 cm. This allows for highly electrically conductive and mechanically stable power terminals.

According to at least one embodiment, the slide rail and the assigned power terminals have the same thickness and/or are of the same material. The same can apply relative to the nose pieces. Hence, the power terminals and the slide rails and the optional nose pieces can easily be manufactured from the same metal sheet.

According to at least one embodiment, the pre-product further comprises a second leadframe. The second leadframe is, for example, thinner than the first leadframe and comprises auxiliary terminals. If there is the at least one substrate, the auxiliary terminals can be attached to the substrate, and, for example, extend in a direction away from the substrate. Thus, additional terminals can efficiently be applied to the electronic device.

According to at least one embodiment, the second leadframe includes an edge rail. The edge rail, or the edge rails, has/have the same function as the at least one slide rail. That is, the at least one edge rail is configured as a support surface during storing, processing, cleaning, inspecting, testing, handling and/or moving the pre-product, and is removed later. By means of the at least one edge rail, damage, like scratches, to the auxiliary terminals can be avoided.

According to at least one embodiment, the edge rail is located along a rim of the second leadframe remote from the substrate. Thus, the edge rail can run along an edge of the second leadframe, seen in top view. Between the edge rail and the auxiliary terminals, there can be nose pieces, too, similar to noses described above as optional features for the first leadframe.

According to at least one embodiment, similar to the slide rail at the power terminals, at least some of the auxiliary terminals are short-circuited by the edge rail. Hence, mechanical stability can be ensured.

According to at least one embodiment, the edge rail is located along a different side, for example, along an opposite side, of the substrate than the at least one slide rail, seen in top view onto a main side of the substrate. For example, the main side is that side of the substrate the at least one electronic component is arranged on. Thus, the edge rail and the slide rail can together form a stable support surface for the pre-product.

According to at least one embodiment, the second leadframe is of a material having a higher hardness than a material the first leadframe is made from. For example, the second leadframe has a hardness of at least 130 HV or of at least 170 HV and/or of at most 220 HV. HV stand for Vickers Hardness. The hardness refers to the conditions of intended use of the electronic device, for example, concerning temperature. For example, the second leadframe is of a copper alloy having the specified hardness.

According to at least one embodiment, the first leadframe is of a material having a hardness of at most 90 HV or at most 110 HV and/or of at least 60 HV. For example, the first leadframe is of copper or of a copper alloy having the stated hardness.

According to at least one embodiment, the pre-product further comprises a mold body. The mold body can be, for example, of a thermoset polymer material or an epoxy resin material. For example, the substrate and the electronic component are partially or completely embedded in the mold body. Thus, protection of the latter components can be provided by means of the mold body.

According to at least one embodiment, the power terminals are only partially embedded in the mold body and, thus, project beyond the mold body. This applies, for example, seen in top view onto the electronic component or on the substrate, if present. The term top view does not necessarily require that the respective component can indeed be seen, for example, if there is an opaque mold body, but refers to the respective line of vision.

According to at least one embodiment, the at least one slide rail is located outside the mold body. For example, the mold body and the slide rail do not touch so that easy removal of the slide rail from the power terminals is enabled.

According to at least one embodiment, sidewall lengths of the mold body are in each case at least 2 cm or at least 4 cm or at least 5 cm or at least 6 cm or at least 8 cm and/or at most 0.2 m, seen in top view onto the main side of the substrate. Accordingly, the electronic device is comparably large.

According to at least one embodiment, a weight of the pre-product and/or of the electronic device is at least 0.1 kg or at least 0.2 kg or at least 0.3 kg and/or at most 2 kg. Thus, there is a significantly increased risk of scratching the power terminals when not having any slide rails.

According to at least one embodiment, for example, seen along a direction of main extent of the slide rail, the mold body protrudes the slide rail or terminates flush with the slide rail. Hence, lateral dimensions of the pre-product along the direction of main extent of the slide rail can be determined by the mold body instead of the slide rail enabling a space saving arrangement. As an alternative, the slide rail could also be longer than the mold body and, thus, could protrude the mold body.

According to at least one embodiment, the first leadframe is bent. For example, the slide rail and end parts of the power terminals can be more distant from a plane defined by a bottom side of a base plate or of the substrate than remaining parts of the first leadframe.

According to at least one embodiment, the first leadframe is of planar fashion and is, for example, oriented in parallel with the substrate. 'Planar fashion', for example, means that the first leadframe is not bent and, thus, is a plane, flat, structured metal sheet. In the present application, the terms parallel and perpendicular, for example, apply in each case with a tolerance of at most 15° or of at most 10° or of at most 5° to take into account manufacturing tolerances.

According to at least one embodiment, the pre-product comprises exactly one substrate. In this case, the pre-product is no leadframe assembly, but the substrates and possibly the mold bodies are already present in an individualized manner. However, if a base plate is present, there can be more than one substrate mounted on the base plate, but then the pre-product, for example, comprises only one base plate carrying all the substrates.

According to at least one embodiment, the electronic component is thermally conductively connected to the base plate. The base plate can protrude the mold body to enable efficient cooling. For example, the electronic component is indirectly connected to the base plate so that the optional substrate or the respective leadframe can be located between the base plate and the electronic component, or the electronic component may alternatively be directly applied to the base plate.

The pre-product comprises a plurality of the slide rails. For example, the slide rails run along different sides, for example, along opposite sides, of the substrate or of the mold body, seen in top view, but there can also be more than one slide rail on the same substrate side or mold body side. If there is a plurality of the slide rails, it is possible that all slide rails belong to the same first leadframe, or there is more than one first leadframe that each comprise one or more than one of the slide rails. The same applies to the edge rail of the optional second leadframe.

A method of using the pre-product is additionally provided. The method uses one or more pre-products, as indicated in connection with at least one of the above-stated embodiments. Features of the pre-product are therefore also disclosed for the method and vice versa.

In at least one embodiment, the method comprises temporarily storing or processing the pre-product in a slot magazine. For example, the slot magazine comprises guiding rails. At least one slot of the slot magazine, and accordingly at least one pair of the guiding rails, is configured to carry one or more than one pre-product.

According to at least one embodiment, the at least one slide rail slides on at least one of the guiding rails during at least one of introducing the pre-product into the slot magazine and extracting the pre-product from the slot magazine and processing the pre-product in the slot magazine. That is, the slide rail is moved when being supported by the guiding rails. Having the at least one slide rail prevents the power terminals from being scratched.

According to at least one embodiment, the method further comprises removing the at least one slide rail. However, the ends of the power terminals remain intact or essentially intact during removing, and the power terminals are, for example, de-short-circuited by means of the removing. In other words, by removing the at least one slide rail, the power terminals are separated and may become individual parts of the former contiguous first leadframe. The same applies to the optional second leadframe. The removing is, for example, a cutting, breaking, filing and/or milling.

The removing the slide rail results in removal points at the ends of the terminals. The removal points can be stubs protruding the ends or can also be recesses into the ends.

An electronic device is additionally provided. The electronic device is made from the pre-product, as indicated in connection with at least one of the above-stated embodiments. Features of the pre-product are therefore also disclosed for the electronic device and vice versa.

In at least one embodiment, the electronic device comprises:
  as an option, a substrate,
  at least one electronic component,
  a plurality of metallic power terminals for external electrical contacting the electronic device, the power terminals are electrically connected to the electronic component and extend in a direction away from the electronic component,
  for example, removal points at ends of the power terminals, and
  for example, a mold body, the optional substrate and the electronic component are partially or completely embedded in the mold body, and the power terminals are, as an example, only partially embedded in the mold body and project beyond the mold body,
wherein a weight of the electrical device is at least 0.1 kg and/or and the electronic device is configured to be loaded with a maximum current of at least 10 A.

According to at least one embodiment, end faces of the removal points are bare metallic faces, for example, resulting from removing the slide rail through the nose pieces or through the power terminals. Remaining parts of the power terminals, not embedded in the mold body, can be provided with a coating. The bare metallic end faces are, for example, of a core material of the power terminals, that is, for example, of copper or of a relatively soft copper alloy.

According to at least one embodiment, the removal points are stubs or recesses. An average length of the stubs or an average depth of the recesses is at most the thickness of the power terminals or at most 50% or at most 20% of said thickness. Alternatively or additionally, said length is at most 0.5 mm or at most 0.2 mm. Having such a small length or depth of the stubs or recesses can ensure that the removal points do not disturb functionality of the device. The average length or depth is the sum of all lengths or depths divided by the number of stubs or recesses, respectively.

The electric device is, for example, a power module in an electric vehicle to convert direct current from a battery to alternating current for an electric motor, for example, in hybrid vehicles or plug-in electric vehicles.

A pre-product, a method and an electronic device described herein are explained in greater detail below by way of exemplary embodiments with reference to the drawings. Elements which are the same in the individual figures are indicated with the same reference numerals. The relationships between the elements are not shown to scale, however, but rather individual elements may be shown exaggeratedly large to assist in understanding.

Figure 6:
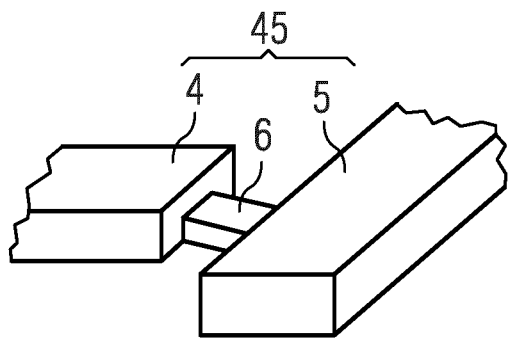
Figure 7:
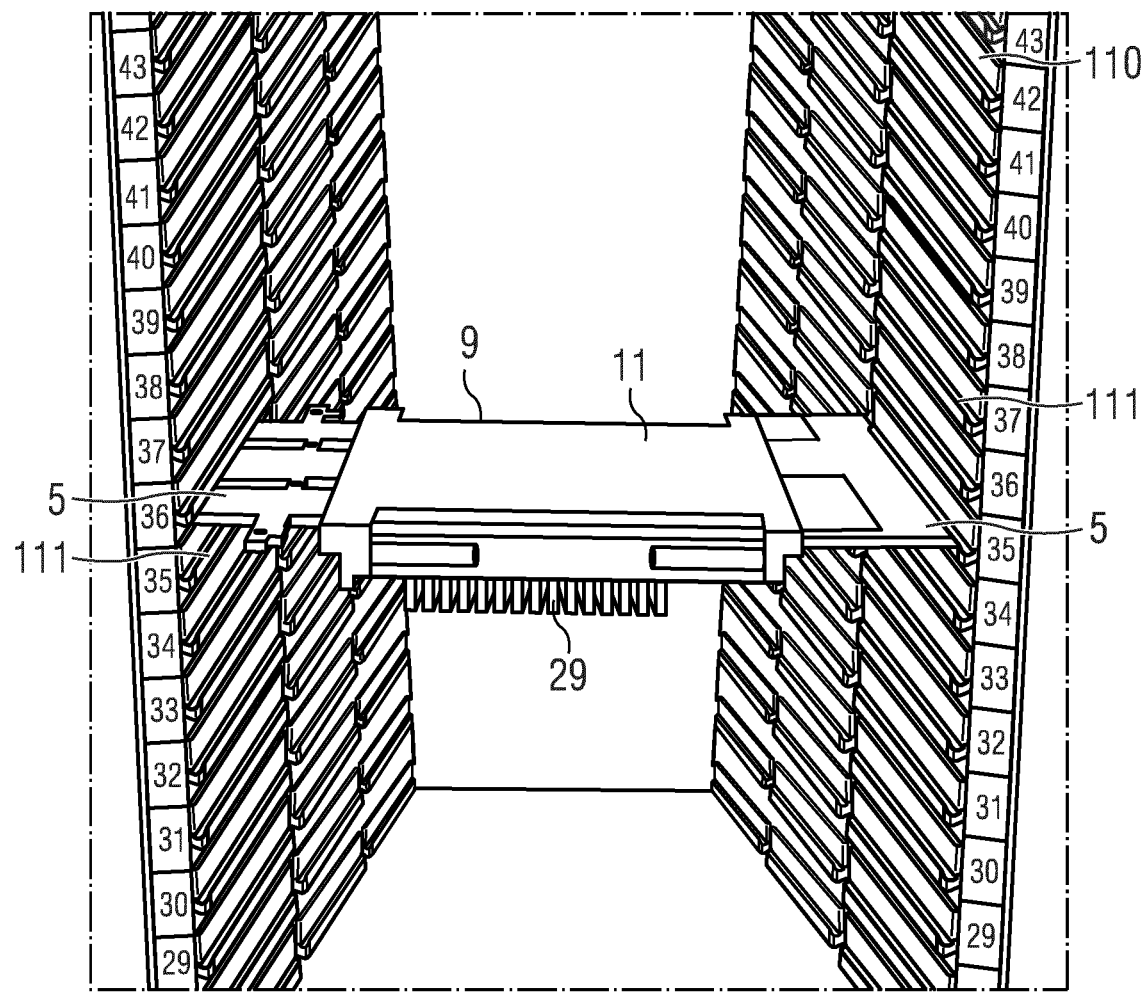
Figure 10:
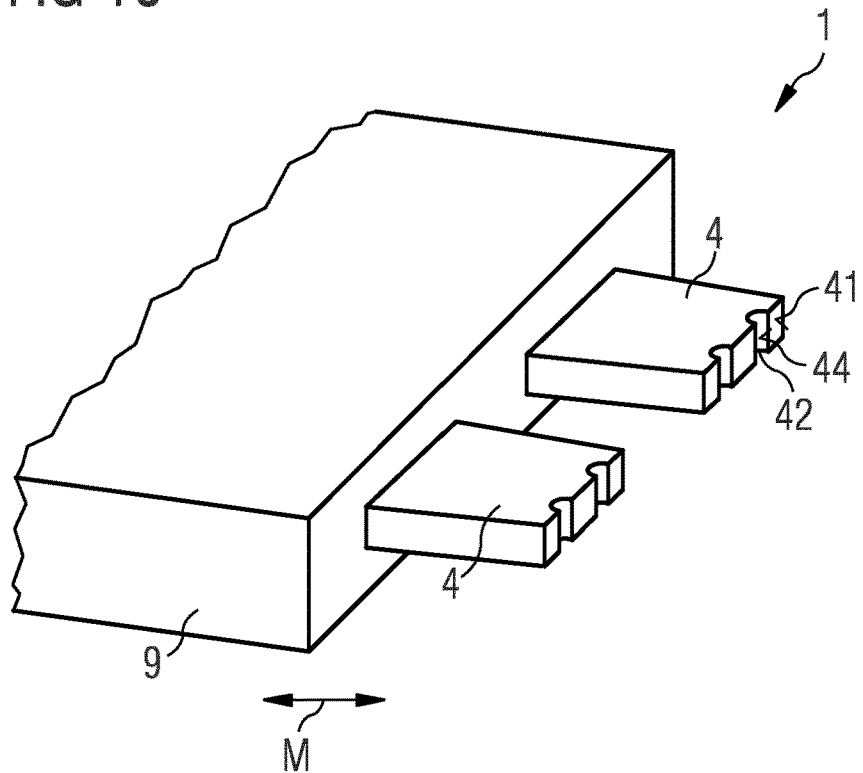
Figure 11:
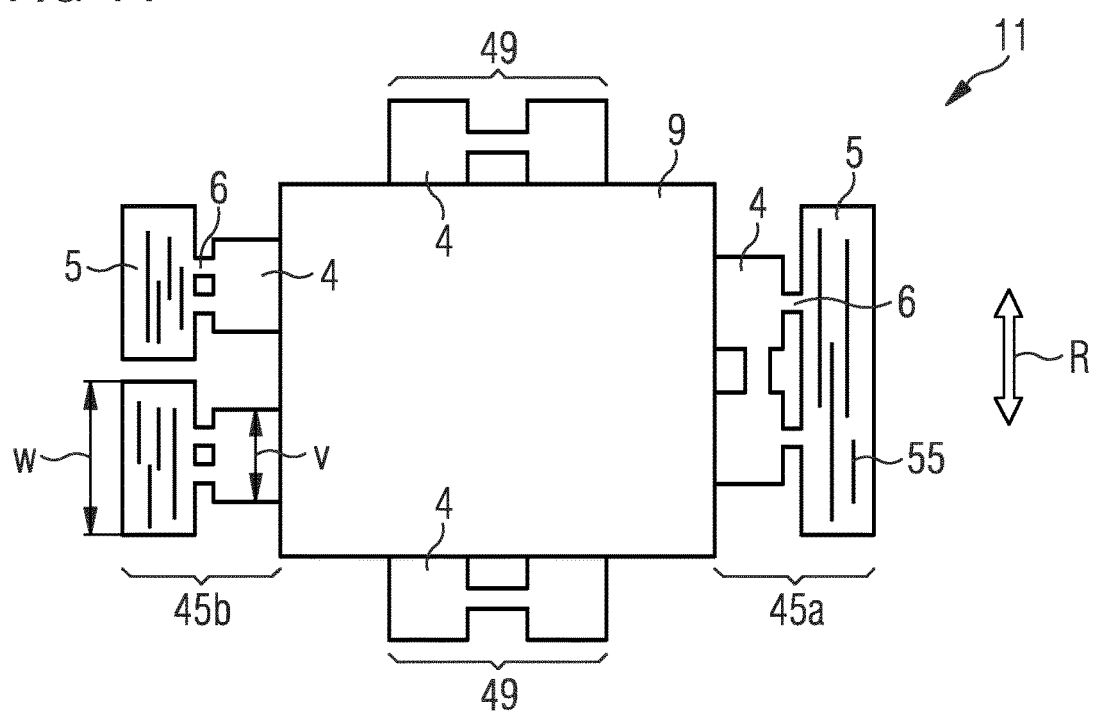
Figure 12:
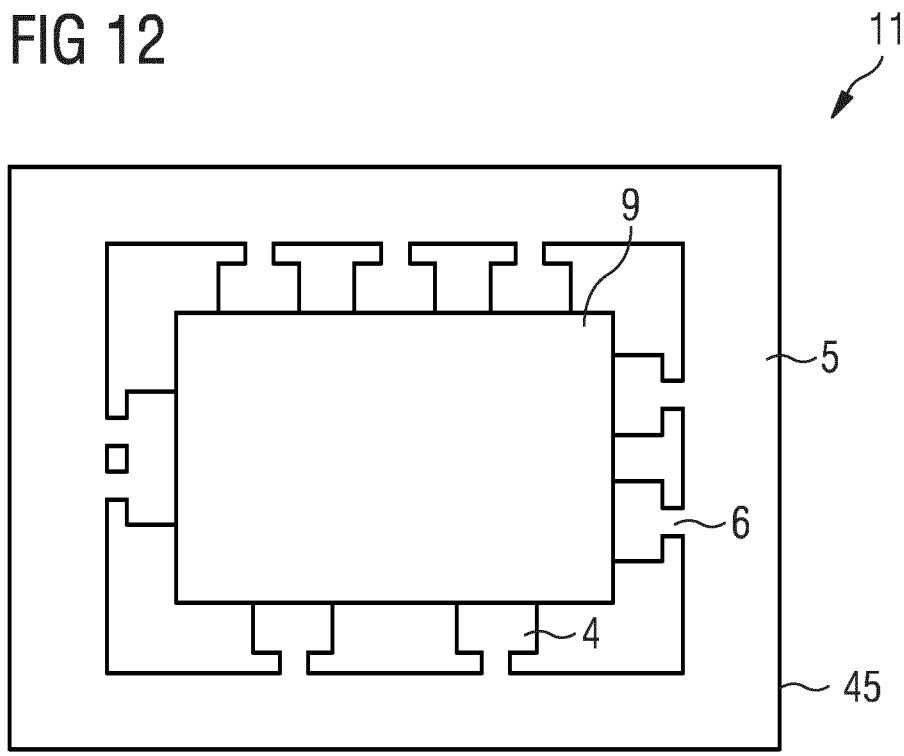
Figure 13:
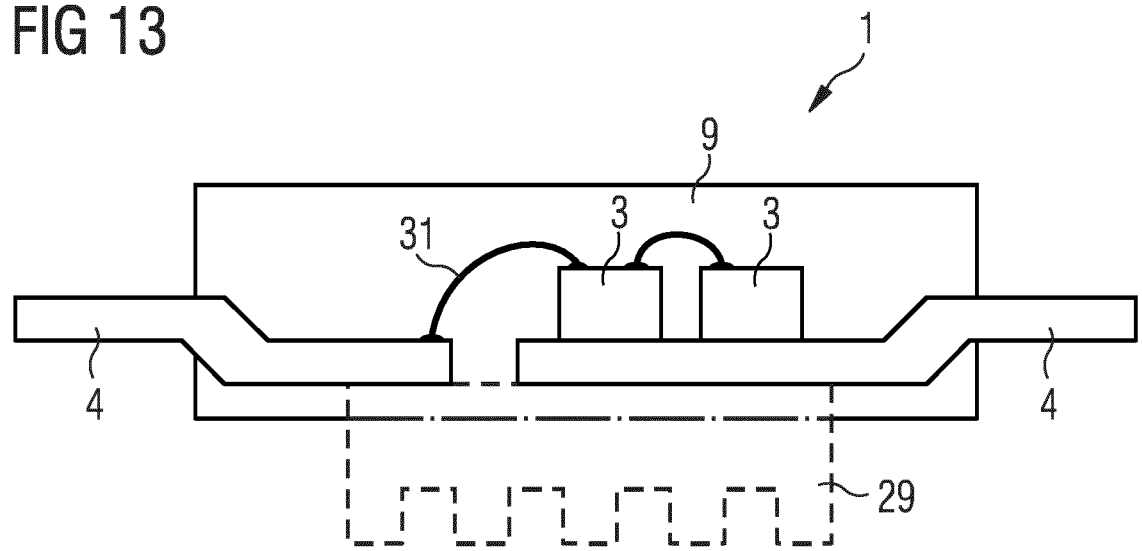

In the figures:

FIG. 1 is a schematic top view of an exemplary embodiment of a pre-product described herein, FIG. 2 is a schematic side view of the pre-product of FIG. 1, FIG. 3 is a schematic perspective view of an exemplary embodiment of a pre-product described herein, FIG. 4 is a schematic top view of an exemplary embodiment of a pre-product described herein, FIGS. 5 and 6 are schematic perspective views of power terminals and slide rails of exemplary embodiments of pre-products described herein, FIG. 7 is a schematic perspective view of an exemplary embodiment of a pre-product described herein in a slot magazine, FIG. 8 is a schematic block diagram of an exemplary embodiment of a method using a pre-product described herein, FIGS. 9 and 10 are schematic perspective views of exemplary embodiments of electronic devices described herein, FIGS. 11 and 12 are schematic top views of exemplary embodiments of a pre-products described herein, and FIG. 13 is a schematic cross-sectional view of an exemplary embodiment of an electronic device described herein.

FIGS. 1 and 2 illustrate an exemplary embodiment of a pre-product 11 for an electronic device 1.

The pre-product 11 includes a substrate 2. The substrate 2 is a ceramic substrate, for example. Hence, the substrate comprises a non-metallic base body 21 which may be made of a ceramic like aluminum oxide. On a main side 20, the substrate 2 comprises a metallic coating 22 that is, for example, structured to form conductor tracks and electrical contact faces. The substrate 2 is, for example, rigid so that it does not bend in the intended use of the pre-product 11. For example, the substrate 2 is a direct bonded copper substrate, DBC substrate for short, and the metallic coating 22 is a metallization applied to the base body 21.

For example, there is another metallic coating 23 at a bottom side of the substrate 2. As an option, for example, by means of vias, the metallic coatings 22, 23 may electrically be connected, not shown. Moreover, there can be more than one metallic coating 22, 23 per main side of the substrate 2, and stacked metallic coatings 22, 23 may be separated by additional insulating layers, not shown.

As an option, there is a base plate 29 at the metallic coating 23. The base plate 29 is, for example, a metallic heat sink, but can also be of another thermally conductive material like a ceramic. A thickness of the base plate 29, for example, exceeds a thickness of the substrate 2, other than shown in FIG. 2. The base plate 29 may protrude the substrate 29, but can also terminate flush with the substrate 2, or the substrate 2 projects beyond the base plate 29 as illustrated in FIG. 2. To simplify the drawings, the base plate 29 is shown only in FIG. 2 but not in FIG. 1. Such a base plate 29 can also be present in all other exemplary embodiments.

On the main side 20 of the substrate 2, there is, for example, an electronic component 3 which is, for example, a semiconductor chip; however, the electric component 3 may alternatively be mounted later. The representation of FIGS. 1 and 2 is only a simplification so that there can be a plurality of electronic components 3 and/or a far more complex pattern of conductor tracks. It is possible that the at least one electronic component 3 is located at least partially on the metallic coating 22. Moreover, there may be connecting means like bond wires 31 to contact the at least one electronic component 3.

In the following, the substrate 2 and the circuitry thereon are not described in any detail. However, the afore-mentioned aspects of the substrate 2 and the electric component 3, for example, also apply to all other exemplary embodiments.

The pre-product 11 also comprises a first leadframe 45. For example, the first leadframe 45 is made of a comparably soft material like copper or a copper alloy of a low hardness. The first leadframe 45 is, for example, a single piece of a single material. Alternatively, the first leadframe 45 may be a composite of more than one material. The same applies to all other exemplary embodiments.

The first leadframe 45 is composed of power terminals 4 and of a slide rail 5. As an option, between the power terminals 4 and the slide rail 5 there are nose pieces 6. The nose pieces 6 are narrower, that is, they have a smaller width, than the power terminals 4. The nose pieces 6 protrude ends 41 of the power terminals 4, along a direction M of main extent of the power terminals 4.

According to FIGS. 1 and 2, there are two power terminals 4. However, there can be a deviating number of power terminals 4, for example, up to ten power terminals 4 or up to six power terminals 4. Moreover, there can be more than one nose piece 6 per power terminal 4. For example, all the power terminals 4 of a first leadframe 45 are connected to the same slide rail 5. The slide rail 5 is, for example, oriented perpendicular with the direction M, and the slide rail 5 may project beyond the substrate 2, seen in top view, or may terminate flush with the substrate 2, contrary to what is illustrated in FIG. 1. The same applies to all other exemplary embodiments.

The first leadframe 45 is, for example, of bent fashion. That is, the slide rail 5 and end parts of the power terminals 4 are more distant from the upper side metallic coating 22 than the parts of the power terminals 4 next to the electronic component 3. As an alternative, the first leadframe 45 can be of flat fashion without any bending out of the drawing plane of FIG. 1. The same applies to all other exemplary embodiments.

Further, the first leadframe 45 is connected to the substrate 2 in a rigid manner. That is, the first leadframe 45 does not significantly move or bend relative to the substrate 2 in the intended use of the pre-product 11. For example, the first leadframe 45 is connected to the substrate 2 by means of friction welding, laser welding, sintering or soldering.

A thickness t1 of the first leadframe 45 is, for example, more than 1 mm, for example, 1.2 mm. Therefore, the first leadframe 45 is comparably stiff. A length L of the nose pieces 6 is relatively small to ensure a rigid first leadframe 45. Said length L is, for example, at most twice the thickness t1 or at most 1.5 times the thickness t1. For example, the length L is equal to the thickness t1, that is, in the present example, is 1.2 mm. A width of the nose pieces 6 is, for example, at least 0.5 mm and/or at most 5 mm. To have a large support surface provided by the slide rail 5, a breadth b thereof is, for example, at least 3 mm or 5 mm. Alternatively or additionally, the breadth b may be at most 10 mm. Further, for example, the slide rail 5 has a large width w of at least 5 cm and/or of at most 10 cm along the substrate 2. The same applies to all other exemplary embodiments.

As an option, the pre-product 11 can include a second leadframe 78. The second leadframe 78 comprises auxiliary terminals 7 configured to provide control signals to the electric component 3, for example. Moreover, there is an edge rail 8 connecting the auxiliary terminals 7. Because currents fed through the auxiliary terminals 7 are small compared with the power terminals 4, the auxiliary terminals 7 are narrower and the second leadframe 78 has a smaller thickness t2 of, for example, at least 0.1 mm and/or at most 0.25 mm or at most 0.8 mm. For example, the thickness t2 is 0.6 mm. Contrary to what is shown in FIG. 1, also the second leadframe 78 could comprise nose pieces similar to the first leadframe 45. The second leadframe 78 may be of flat fashion or may comprise bents, too. For example, the second leadframe 78 is if a relatively hard material.

The second leadframe 78 may be replaced by another first leadframe, so that there could be two first leadframes 45. It is also possible that there are two second leadframes 78. Moreover, the second leadframe 78 could be supplemented by another first leadframe 45, so that there could be an overlapping or indenting arrangement, or said leadframes 45, 78 are arranged next to each other when seen in top view. Further, there can be leadframes, for example, first leadframes 45, not only at two, but also at three or four sides of the substrate 2, seen in top view. The same applies to all other exemplary embodiments.

The pre-product 11 of FIG. 3 additionally comprises a mold body 9. A sidewall length B of the mold body 9 is large and may be at least 4 cm and/or at most 20 cm. The mold body 9 may protrude the slide rails 5. A thickness of the mold body 9 is, for example, at least 3 mm or 5 mm and/or at most 2 cm or 5 cm.

As an option, there are two first leadframes 45 on opposite sides of the mold body 9. However, there can also be four first leadframes 45 on all four sides of the mold body 9. As in FIGS. 1 and 2, there may also be the optional second leadframe 78 comprising the edge rail 8. If there is a base plate 29 as illustrated in FIG. 2, the base plate 29, for example, protrudes the mold body 9 in a direction away from the metallic coating 23.

For the rest, the same as in FIGS. 1 and 2 also applies to FIG. 3.

FIG. 4 provides a view on an exemplary embodiment of the pre-product 11. The first leadframe 45 and the optional second leadframe 78 have more complex shapes than in FIGS. 1 to 3. At the side of the second leadframe 78, there is an additional terminal 4 that can be part of an additional first leadframe 49 which is free of a slide rail. That is, the thicker additional first lead frame 49 and the thinner second leadframe 78 are applied in an indented manner. Because of this indented arrangement, it is sufficient that the second leadframe 78 comprises the edge rail 8, and there is no need for having an additional slide rail at the additional first leadframe 49.

There may be additional noses between adjacent power terminals 4 in the first leadframe 45, and the power terminals 4 can have different shapes. This is also valid for the second leadframe 78, like in all other exemplary embodiments. Moreover, the mold body 9 can also be of a more complex shape, but is still of cubic shape. Furthermore, as an option, the auxiliary terminals 7 can be provided with pins 71 or can be shaped as pins 71 at their ends.

The terminal structure in FIG. 4 refers to the situation before a trim and form process, where dam bars and peripheral leadframe parts are removed. During the trim and form process, the power terminals 4 are de-shorted.

As in all other exemplary embodiments, a width v of the power terminals 4 is, for example, at least 0.5 cm at least 1 cm and/or at most 5 cm. The breadths b of the edge rail 8 and of the slide rail 5 may the same whereas for the second leadframe 78, the breadth b may refer to a minimum breadth. The complete edge rail 8 may have a rather complicate shape so that the auxiliary terminals 7 are generated by punching of the second leadframe 45 and may be apparent just after such a punching process.

In FIGS. 5 and 6, further options for the nose pieces 6 are illustrated. According to FIG. 1, the nose pieces 6 have the same thickness as the power terminals 4. In FIG. 5, the nose pieces 6 have the same width as the power terminals 6, but are thinner than the power terminals 6, whereas the power terminals 6 and the slide rail 5 can still have the same thickness. FIG. 6 shows a combination of the nose pieces 6 illustrated in FIGS. 1 and 5, that is, the nose pieces are thinner and narrower than the power terminals 4 and the slide rail 5.

The nose pieces 6 of FIGS. 1, 5 and 6 can accordingly be used in all exemplary embodiments.

FIG. 7 shows a slot magazine 110 for storage and/or processing having guiding rails 111. In the slot magazine 110 on the guiding rails 111, there is the pre-product 11. In connection with FIG. 7, in the following the effect of the slide rails 5 is explained in more detail.

There is a trend in the power semiconductor market towards large molded power packages having package bodies, that is, mold bodies, with up to 80 mm side length and leadframes 45 made of thick copper sheets. An example of the use of corresponding large power packages is the automotive branch.

There are many challenges in the realization of such a design of power packages, but also in the manufacturing process. Here not only all process steps themselves in the manufacturing need to be considered, but also the handling and the storage of these modules between the single production steps and the introduction of the modules to the production machines. Consequently, the module design needs to take into account issues of handling, processing and storage.

Molded leadframe based packages are used, for example, in the IC market, but also in power electronics for comparably small power packages. These packages are comparably small having a body size with a side length of up to about 40 mm and a thickness of a few millimeters. Consequently, the package weight of a few grams is not very large and causes only minor issues. Additionally, leadframes used for corresponding products are mostly made from comparably hard copper alloys like C7025 or C19400.

Otherwise, the novel large molded power packages of the pre-product 11 and of the electronic device 1 described herein having a size of the molded body of about 80 mm side length and a thickness of about 10 mm and having a leadframe comprising at least partly thick copper sheets, have a clearly larger weight. Such modules may have a weight of about 300 g or even more, not considering the optional base plate 29. In contrast to small molded packages, at least the thick power terminals 4 are mostly made from comparably soft pure copper or a soft copper alloy with only a minor content of other materials providing optimum electrical conductivity.

In the manufacturing of molded packages, leadframe strips with chips and molded bodies are typically stored or processed in slot magazines 110, which is a standard storage, processing and handling method. Here, the leadframe strips are inserted into the slots using the peripheral parts of the strips laid on positioning bars. In general, a storage of large molded power packages in slot magazines is also possible as shown in FIG. 7.

Unfortunately, the positioning bars, that is, the guiding rails 111, in the slot magazine 110 are providing bare metal surfaces. So a metal-on-metal mechanical contact occurs during loading and unloading. For IC packages having only a small weight combined with a comparably hard copper alloy, this is not critical, for example, if only peripheral parts of the leadframe, which are later removed in the trim and form process, are used for positioning. Otherwise, for large molded power packages described herein having a considerable weight of a few hundred grams, this metal-on-metal contact provides mechanical impact on the leadframe, for example, if the affected terminals are made from comparably soft copper or soft copper alloy. For example, the positioning is provided on one side by a peripheral portion 8 of the second leadframe strip 78 on the side of the auxiliary terminals 7, and on the other side by the ends of the thick and broad power terminals.

This is less critical on the side of the auxiliary terminals 7, where an edge rail 8 area, which is later removed in the trim and form process, exists on the side of the auxiliary terminals 7 made from a hard copper alloy. For example, on the side of the power terminals 4 made of soft pure copper or a soft copper alloy, which are exposed to the mechanical contact, a movement of the power packages during loading or unloading causes scratches on terminals due to mechanical impact, if there are no slide rails 5. These scratches may be a critical issue with respect to the visual acceptance, which may be on first view only a cosmetic issue, but eventually endangering the customer acceptance. Additionally, corresponding scratches may cause a potential issue for the terminal connection to busbars in the customer application.

The present pre-product 11 and the resulting electronic device 1 are basing on an approach to prevent the generation of scratches on power terminals 4 by loading or unloading of the modules 11 to a slot magazine 110 by a modified leadframe layout. This is realized by an additional sliding area of the first leadframe 45 adhering to the front sides, that is, the ends 41, of the power terminals 4 as shown, for example, in FIG. 4. This sliding area is realized by the slide rail 5 and suffers from the mechanical metal-on-metal contact to the positioning bars 111 in the slot magazines 110 instead of the power terminals 4. The sliding area is adhering to the power terminals 4 by the small nose pieces 6, so that the slide rail 5 can easily be removed by stamping during the trim and from process at the end of the manufacturing process. Consequently, scratches on the sliding area are not critical. This is also valid for the optional second leadframe.

With respect to the cost of the new leadframe design presented herein, there is no significant cost adder compared with the previous leadframe design, although slightly more material may be required for the first leadframe, and maybe for the second leadframe, but material later removed can be recycled. The introduction of the slide rail 5 only produces less waste on the supplier side during a stamping process.

Thus, the present design feature can be highlighted as an additional side rail part 5 of the first leadframe 45 of the power module 11, which is adhering to the front surfaces 41 of the terminals 5 using the nose pieces 6.

Differences between first leadframes 45 used for large molded power packages and those used for small IC packages are thus caused by the size of the package body 9, but also by the type of terminals 4. Package bodies 9 of large molded power packages have a large side length, so that the leadframe strip may have the width of only one power module 11, or the leadframe strip 5 is providing the terminals 4 on only one side, as it may be related to a power package design where power and auxiliary terminals 4, 7 are made from different copper alloys. Contrary to that, in the case of IC packages, the leadframe strip used in production may contain several rows of small packages, where terminals of the same material are positioned on two or on all four sides of the package body.

The thickness of the first leadframe 45 for the power terminals 4 is significantly larger than that used for small molded packages. Leadframes and consequently terminals used for small molded packages, for example, IC packages, have a thickness of 0.25 mm at most, whereas the power terminals 4 of the large molded power package have a thickness of 1 mm or more. Additionally, the width of terminals used in small molded packages is typically less than 1 mm, whereas the power terminals 4 of the large molded power packages may have a width of more than 10 mm.

In the case of a large molded power package, the terminal structure may be realized by two different leadframe strips consisting of different materials. So the thick power terminals 45 are mostly made of soft pure copper or a soft copper alloy to provide optimum electrical conductivity. The thin auxiliary terminals 7 with no requirement for a large current capability, but the need for sufficient mechanical stability, are, for example, made from harder copper alloys.

Because of the large width and thickness of the power terminals 4, for example, there is no connection between the slide rail 5 and the complete front side of the terminals 4. Consequently, the small nose pieces 6 are needed to facilitate the removal of the slide rail 5 forming the sliding area by stamping in the trim and form process.

In FIG. 8, a method using the pre-product 11 is illustrated only schematically. According to step S1, the pre-product 11 having the substrate 2 and the first leadframe 45 is provided, and the pre-product 11 may be stored in the slot magazine 110 or may be handled using rails. As an option, the at least one electronic component 3 has already been mounted on the substrate 2. Accordingly, in method step S1 the pre-product corresponds to a configuration similar to what is illustrated in FIGS. 1 and 2.

In method step S2, the mold body 9 is formed, compare, for example, FIG. 3. Then, in optional method step S3, the mold body 9 is cured, that is, post mold curing is performed. This curing can be done having the pre-product 11 again in a slot magazine 110.

In method step S4, the pre-product 11 is again stored in a slot magazine 110, and optionally testing or inspecting of the pre-product 11 is performed. For testing or inspecting, the pre-product 11 may temporarily be removed from the slot magazine 110 and may again be inserted into the slot magazine 110, for example, to perform geometric testing, by X-ray analysis or the like.

Finally, in method step S5 the at least one slide rail 5 and the optionally present edge rail 8 are removed in a trim and form process to get the finished electric device 1, see FIG. 9.

There can be additional method steps not illustrated in FIG. 8, like a cleaning step before the molding step S3, or further processing steps. Thus, the method illustrated in FIG. 8 can be supplemented by additional method steps, or some method steps may be omitted or substituted by other method steps.

See FIGS. 9 and 10, examples of the finished electric device 1 are illustrated. Compared with the pre-product 11, the rails 5, 8 are no longer present in the electric device 1. Thus, at the location of the former rails 5, 8, there are removal points 42.

In FIG. 9, from the nose pieces 6 or from the slide rail 5, at the removal points 42 small stubs may remain at the ends 41. The stubs result from removing the nose pieces 6, for example, by means of punching. Thus, the stubs, for example, comprise a bare metal end face 44 created by the removing the nose pieces 6.

Remaining parts of the power terminals 4 may be provided with a coating 43, for example, to protect the power terminals 4 from corrosion and/or to improve electrical contact to the power terminals 4 when the device 1 is mounted by a customer. This applies, for example, for main faces of the power terminals 4, while side faces, including the ends 41, may be free of any coating like the end face 44. The end face 44 may have a higher average roughness than the other surfaces of the power terminal 4.

As shown in FIG. 10, the removal points 42 are not shaped as stubs, but are small recesses into the ends 41 of the power terminals 4. Moreover, as in all other exemplary embodiments, there can be more than one removal point 42 per power terminal 4. Otherwise, the same as to FIG. 9 also applies to FIG. 10, for example, concerning the at least one coating 43.

In the exemplary embodiments of FIGS. 11 and 12, various configuration options are illustrated. On the right side in FIG. 11, there is a first leadframe 45a similar to FIG. 1. There can be one or more first leadframes 45b, see the left side in FIG. 11, wherein the power terminals 4 each have its own slide rail 5. For example, the width b of the respective slide rails 5 is larger than the width v of the associated power terminal 4.

On the bottom and top side of the representation in FIG. 11, as an option there are additional first leadframes 49 having no slide rails. That is, the slide rails 5 of the first leadframes 45a, 45b can be sufficient to support and guide the pre-product 11. At least one of the first leadframes 45a, 45b, 49 may be replaced by a second leadframe having the edge rail, not shown.

Moreover, see FIG. 11, the slide rails 5, or at least one of the slide rails 5, may have scratches 55 along a sliding direction R of the pre-product 11, due to the sliding of the pre-product 11 along the slide rails 5 during manufacturing. For example, a depth of the scratches 55 is at least 5 μm and/or at most 0.1 mm. Otherwise, a surface roughness, Ra, of the at least one first leadframe is, for example, at most 0.5 μm. The same can apply to all other embodiments.

According to FIG. 12, there is one common slide rail 5 that extends along different sides of the mold body 9. It is possible that there are different numbers of power terminals 4 and different designs of the nose pieces 6 along different sides of the mold body. As an alternative, there may be four slide rails 5, each along one side of the mold body 9. Similar to FIG. 11, at least one of the power terminals 4 may be replaced by an auxiliary terminal, not shown, as long as at least two of the power terminals 4 remain.

The various designs illustrated in FIGS. 11 and 12 can be used in all other exemplary embodiments, too, individually or, if applicable, in combination.

In FIG. 13 another exemplary embodiment of the electric device 1 is shown. The electronic components 3, that is, the semiconductor chips, are directly mounted on the power terminals 4, and electrical wiring may be achieved by bond wires 31. That is, no substrate is required. There may also be auxiliary terminals, not shown. The same can apply to all other embodiments of the electric device 1 and of the pre-product 11 so that the substrates 2 can be optional.

As a further possibility, the base plate 29 can be present, and the power terminals 4, and the optional auxiliary terminals, could be applied to the base plate 29. In this case, the base plate 29 includes an electrically insulating layer near the terminals or is of an electrically insulating material. As a further option, not shown, at least one of the electronic components 3 may be attached directly to the base plate 29 without an intermediate substrate or terminal. The same applies to all other embodiments.

The invention described here is not restricted by the description given with reference to the exemplary embodiments. Rather, the invention encompasses any novel feature and any combination of features, including in particular any combination of features in the claims, even if this feature or this combination is not itself explicitly indicated in the claims or exemplary embodiments.

This patent application claims the priority of European patent application 20194119.2, the disclosure content of which is hereby incorporated by reference.

LIST OF REFERENCE SIGNS 1 electronic device
11 pre-product for the electronic device
2 substrate
20 main side of the substrate
21 non-metallic base body of the substrate
22 metallic coating on a top side (main side)
23 metallic coating on a bottom side
29 base plate
3 electronic component
31 bond wire
4 power terminal
41 end of the power terminal
42 removal point at the end
43 coating
44 bare metallic end face of the removal point
45 first leadframe
49 additional first leadframe
5 slide rail
55 scratch
6 nose piece
7 auxiliary terminal
71 pin
78 second leadframe
8 edge rail
9 mold body
110 slot magazine
111 guiding rail
b breadth of the slide rail
B sidewall length of the mold body
t1 thickness of the first leadframe
t2 thickness of the second leadframe
v width of the power terminal
w width of the slide rail
M direction of main extent of the power terminal
R sliding direction
S . . . method step

The invention claimed is:

1. A pre-product for an electronic device configured to be loaded with a maximum current of at least 10 A comprising:
an electronic component,
power terminals for external electrical contacting the electronic device, wherein the power terminals are electrically connected to the electronic component and extend in a direction away from the electronic component, a slide rail at an end of at least one assigned power terminal, the end being remote from the electronic component, wherein the slide rail is integrated in a first leadframe together with at least one of the power terminals, a weight of the pre-product is at least 0.1 kg, a width of the slide rail is at least 1 cm in a direction perpendicular to a main extent of the at least one assigned power terminal, an extent of the slide rail is at least 1 mm in the direction parallel to the main extent of the assigned power terminals, and a width of the power terminals at the ends is in each case at least 1 mm in the direction perpendicular to the main extent of the power terminal; and the first leadframe comprises nose pieces having a length that, between the end of the at least one assigned power terminal and the slide rail, is at most 25% of a breadth of the slide rail.

2. The pre-product according to claim 1, wherein the nose pieces are located in each case between one of the ends of the power terminal and the slide rail.

3. The pre-product according to claim 1, further comprising a substrate, wherein the electronic component is mounted on the substrate, and the power terminals are rigidly attached to the substrate and extend in a direction away from the substrate.

4. The pre-product according to claim 3, wherein the slide rail integrated in the first leadframe short-circuits all the power terminals of the first leadframe.

5. The pre-product according to claim 1, wherein the slide rail and the assigned power terminals have the same thickness and/or are of the same material.

6. The pre-product according to claim 1, wherein the first leadframe is of copper or of a copper alloy having a hardness of at most 110 HV.

7. The pre-product according to claim 1, further comprising a second leadframe, wherein the second leadframe is thinner than the first leadframe and comprises auxiliary terminals, and the second leadframe includes an edge rail.

8. The pre-product according to claim 7, wherein the edge rail is located along a rim of the second leadframe remote from the substrate, at least some of the auxiliary terminals are short-circuited by the edge rail, the edge rail is located along a different side of the substrate than the slide rail, and the second leadframe is of a copper alloy having a greater hardness than a material of the first leadframe.

9. The pre-product according to claim 1, further comprising a mold body, wherein the electronic component is at least partially embedded in the mold body, the power terminals are partially embedded in the mold body and project beyond the mold body, seen in top view, and the slide rail is located outside the mold body.

10. The pre-product according to claim 9, further comprising a base plate, wherein the electronic component is thermally conductively connected to the base plate and the base plate protrudes the mold body.

11. The pre-product according to claim 9, wherein, seen along a direction of a main extent of the slide rail, the mold body protrudes the slide rail or terminates flush with the slide rail, and the slide rail is spaced apart from the mold body.

* * * * *